US009799572B2

(12) United States Patent
Oura

(10) Patent No.: US 9,799,572 B2
(45) Date of Patent: Oct. 24, 2017

(54) MANUFACTURING METHOD OF SEMICONDUCTOR DEVICE

(71) Applicant: Renesas Electronics Corporation, Tokyo (JP)

(72) Inventor: Takehiro Oura, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/919,153

(22) Filed: Oct. 21, 2015

(65) Prior Publication Data
US 2016/0190022 A1 Jun. 30, 2016

(30) Foreign Application Priority Data
Dec. 25, 2014 (JP) .................................. 2014-263483

(51) Int. Cl.
*H01L 21/66* (2006.01)
*H01L 21/02* (2006.01)
*H01L 21/311* (2006.01)

(52) U.S. Cl.
CPC ........ *H01L 22/14* (2013.01); *H01L 21/02063* (2013.01); *H01L 21/02178* (2013.01); *H01L 21/02244* (2013.01); *H01L 21/02255* (2013.01); *H01L 21/31116* (2013.01); *H01L 21/31138* (2013.01)

(58) Field of Classification Search
CPC ............... H01L 22/14; H01L 21/02178; H01L 21/02244; H01L 21/02255; H01L 21/283; H01L 21/31116
See application file for complete search history.

(56) References Cited

U.S. PATENT DOCUMENTS

| | | | | |
|---|---|---|---|---|
| 5,380,401 A | * | 1/1995 | Jones | H01L 21/02071 134/1 |
| 5,476,816 A | * | 12/1995 | Mautz | H01L 21/32136 257/E21.311 |
| 5,716,494 A | * | 2/1998 | Imai | H01L 21/30604 257/E21.219 |
| 5,731,243 A | * | 3/1998 | Peng | H01L 21/02046 257/E21.226 |
| 5,824,234 A | * | 10/1998 | Jou | H01L 21/31138 216/18 |

(Continued)

FOREIGN PATENT DOCUMENTS

JP 2003-036692 A 2/2003

*Primary Examiner* — Mohammed Shamsuzzaman
(74) *Attorney, Agent, or Firm* — Mattingly & Malur, PC

(57) ABSTRACT

Degradation of reliability of a semiconductor device is prevented. An electrode pad included mainly of aluminum is formed over a main surface of a semiconductor wafer. Subsequently, a first insulating member and a second insulating member are formed over the main surface of the semiconductor wafer so as to cover the electrode pad, and thereafter an opening portion that exposes a surface of the electrode pad is formed in the first insulating member and the second insulating member by a dry etching method using an etching gas including a halogen-based gas. Thereafter, an oxide film with a thickness of 2 nm to 6 nm is formed over the exposed surface of the electrode pad by performing a heat treatment at 200° C. to 300° C. in an air atmosphere, and then the semiconductor wafer is stored.

8 Claims, 8 Drawing Sheets

(56) References Cited

U.S. PATENT DOCUMENTS

| | | | | |
|---|---|---|---|---|
| 5,872,061 A * | 2/1999 | Lee | H01L 21/31116 | 134/1.2 |
| 5,930,664 A * | 7/1999 | Hsu | H01L 21/31116 | 257/E21.252 |
| 5,985,765 A * | 11/1999 | Hsiao | H01L 24/02 | 257/E21.507 |
| 6,006,764 A * | 12/1999 | Chu | G03F 7/427 | 134/1.2 |
| 6,063,207 A * | 5/2000 | Yu | H01L 21/76897 | 134/2 |
| 6,214,717 B1 * | 4/2001 | Lan | H01L 24/03 | 257/E21.508 |
| 6,297,160 B1 * | 10/2001 | Chien | H01L 21/76838 | 257/E21.582 |
| 6,361,704 B1 * | 3/2002 | Shih | H01L 21/3212 | 204/192.17 |
| 6,413,863 B1 * | 7/2002 | Liu | H01L 21/32135 | 257/E21.31 |
| 6,566,269 B1 * | 5/2003 | Biles | H01L 21/31122 | 257/E21.226 |
| 6,682,659 B1 * | 1/2004 | Cho | H01L 21/31116 | 216/13 |
| 6,727,185 B1 * | 4/2004 | Smith | H01L 21/31116 | 257/E21.252 |
| 6,794,248 B2 * | 9/2004 | Takagi | H01L 21/02063 | 257/E21.576 |
| 6,989,608 B2 * | 1/2006 | Rochette | H01L 21/76888 | 257/741 |
| 8,198,731 B2 * | 6/2012 | Cichocki | H01L 21/76849 | 257/750 |
| 9,304,283 B2 * | 4/2016 | Soman | G02B 7/09 | |
| 2001/0023127 A1 * | 9/2001 | Andreas | C11D 7/265 | 438/623 |
| 2002/0121703 A1 * | 9/2002 | Toyoda | H01L 21/76834 | 257/762 |
| 2003/0183952 A1 * | 10/2003 | Farrar | H01L 21/0212 | 257/787 |
| 2005/0093565 A1 * | 5/2005 | Okamoto | G01R 1/07307 | 438/14 |
| 2005/0136662 A1 * | 6/2005 | Tsai | H01L 21/02071 | 438/689 |
| 2009/0243118 A1 * | 10/2009 | Akiba | G01R 31/26 | 257/773 |
| 2010/0184285 A1 * | 7/2010 | Hua | H01L 24/03 | 438/612 |
| 2012/0129343 A1 * | 5/2012 | Tamaso | H01L 21/0485 | 438/685 |
| 2016/0181588 A1 * | 6/2016 | Tsunokuni | H02S 50/00 | 429/61 |

* cited by examiner

MANUFACTURING METHOD OF SEMICONDUCTOR DEVICE

CROSS-REFERENCE TO RELATED APPLICATIONS

The disclosure of Japanese Patent Application No. 2014-263483 filed on Dec. 25, 2014 including the specification, drawings and abstract is incorporated herein by reference in its entirety.

BACKGROUND

The present invention relates to a manufacturing method of a semiconductor device. For example, the manufacturing method can be preferably used to manufacture a semiconductor device including an electrode pad mainly including aluminum (Al).

RELATED ART

Japanese Unexamined Patent Application Publication No. 2003-036692 (Patent Document 1) discloses a non-volatile semiconductor storage device including a redundancy replacement block, a redundant address storage unit, and a replacement control unit. In an inspection process of a flash memory of the non-volatile semiconductor storage device, as described in (a fifth embodiment) and FIG. 5, stress from heat treatment is applied while probe inspection is performed.

SUMMARY

A semiconductor wafer that has manufactured in a previous process is normally transferred to an inspection process. However, the semiconductor wafer may stagnate for a long time before the inspection is started or after the inspection is completed. In the semiconductor wafer that stagnates for a long time, a surface of an electrode pad mainly including aluminum (Al) is corroded and a coupling failure occurs between the electrode pad and a conductive member coupled to the electrode pad, so that there is a problem that the reliability of the semiconductor device is degraded.

Other problems and new features will become clear from the description of the present specification and the accompanying drawings.

A manufacturing method of a semiconductor device according to an embodiment first forms an insulating member over a main surface of a semiconductor wafer so as to cover an electrode pad mainly including aluminum (Al), and thereafter forms an opening portion that exposes a surface of the electrode pad in the insulating member by processing the insulating member by a dry etching method using an etching gas including a halogen-based gas such as, for example, fluorine (F) or chlorine (Cl). Thereafter, an aluminum oxide ($Al_2O_3$) film with a thickness of 2 nm to 6 nm is formed over the exposed surface of the electrode pad by performing a heat treatment at 200° C. to 300° C. in an air atmosphere, and then the semiconductor wafer is stored.

According to an embodiment, it is possible to prevent the degradation of the reliability of the semiconductor device.

DETAILED DESCRIPTION

Figure 1:
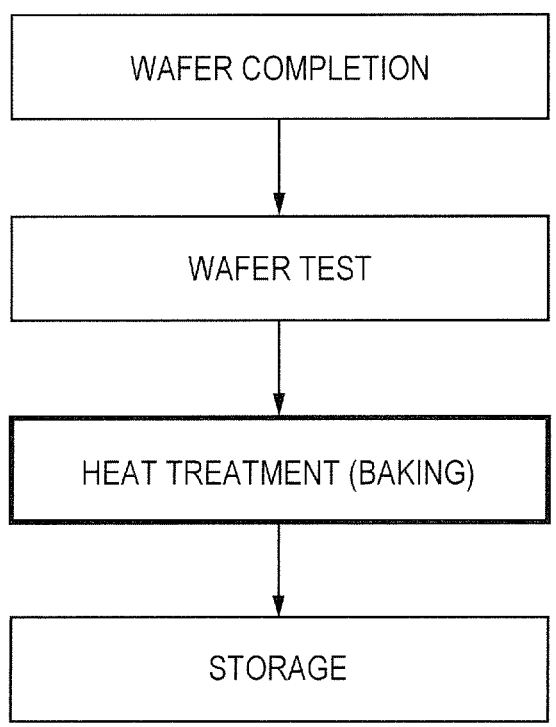
FIG. 1 is a process drawing for explaining a flow of a manufacturing method of a semiconductor device according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Further, when using words of "comprise A", "composed of A", "have A", and "include A", it is needless to say that elements other than A are not excluded, except for the case where it is clearly specified that there is only A, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In the drawings used in the embodiments described below, in order to make a drawing intelligible, hatching may be attached even if it is a plan view. In all the drawings for the explaining the embodiments described below, the same symbol is attached to the same member, as a principle, and the repeated explanation thereof is omitted. Hereinafter, the embodiments will be described in detail based on the drawings.

Detailed Description of Problems

First, problems to be solved by a manufacturing method of a semiconductor device discovered by the inventors will be described in detail in order to more clarify the manufacturing method of the semiconductor device according to the embodiments of the present invention.

A semiconductor wafer that has manufactured in a previous process is stored in a clean room. Thereafter, the semiconductor wafer is transferred a post-process through an inspection process. When the semiconductor wafer is stored, the semiconductor wafer is packaged in a case that houses a plurality of semiconductor wafers or is packaged in a case that houses one semiconductor wafer. When the semiconductor wafer is stored for a long time, the case in which the semiconductor wafer is housed is put in a packaging bag, the packaging bag is deaerated, and thereafter the semiconductor wafer is stored with the case and the packaging bag.

By the way, the semiconductor wafer that has been manufactured in the previous process includes, for example, a plurality of semiconductor elements, a multilayer wiring layer in which a plurality of insulating layers and wiring layers are stacked, and a surface protective film (a passivation film) formed so as to cover the multilayer wiring layer.

A plurality of electrode pads electrically coupled to a plurality of semiconductor elements are arranged over a main surface of the semiconductor wafer. The electrode pad is formed of a wiring in an uppermost layer of the multilayer wiring layer and is exposed from an opening portion formed corresponding to each electrode pad in the surface protective film of the semiconductor wafer. The electrode pad is formed of, for example, an electrically conductive material mainly including aluminum (Al). The surface protective film has a multilayer structure in which, for example, a silicon oxide ($SiO_2$) film, a silicon nitride ($Si_3N_4$) film, and a polyimide film (for example, PIQ (Polyimide-isoindoloquinazolinedion) or the like) are laminated sequentially from the bottom. The polyimide film is effective against software error and is effective for alleviating thermal stress with a sealing resin.

In the post-process, a conductive member (for example, a bonding wire) is electrically and mechanically coupled to the electrode pad by, for example, a nail head bonding (ball bonding) method using thermocompression bonding along with ultrasonic vibration.

However, according to study of the inventors, when the semiconductor wafer is stored for a long time, a surface of the electrode pad is corroded and a coupling failure occurs between the electrode pad and the conductive member coupled to the electrode pad, so that there is a problem that the reliability of the semiconductor device is degraded.

In the inspection process, a good or a defective state of the semiconductor wafer that has manufactured in the previous process is determined for each semiconductor chip formed in the semiconductor wafer before the semiconductor wafer is transferred to post-processing. Specifically, the good or defective state for each semiconductor chip is determined by causing a probe needle formed of, for example, tungsten (W) to come into contact with the electrode pad of each semiconductor chip, measuring electrical characteristics of an integrated circuit for each semiconductor chip formed in the semiconductor wafer, and causing a tester to read the electrical characteristics. However, when the probe needle comes into contact with the electrode pad of the semiconductor chip, a probe mark remains on the electrode pad, so that the surface of the electrode pad tends to be more easily corroded than a case where the probe needle is not caused to come into contact with the electrode pad.

Here, the corrosion of the surface of the electrode pad means mainly formation of insulating fluorine compound or chlorine compound over the surface of the electrode pad. The thickness of the fluorine compound or the chlorine compound is, for example, about 10 μm, so that it is not easy to remove the compound. Therefore, a coupling failure occurs between the electrode pad and the conductive member. Hereinafter, a process in which the fluorine compound or the chlorine compound is formed will be studied.

(1) When an opening portion is formed in the surface protective film in order to expose the surface of the electrode pad, the surface protective film is processed by a dry etching method, and a halogen-based gas is used as an etching gas, so that the etching gas includes, for example, fluorine (F) or chlorine (Cl). When the fluorine (F) or the chlorine (Cl) remains in the surface of the electrode pad, it is considered that the fluorine (F) or the chlorine (Cl) gradually reacts with oxygen (O) contained in the atmosphere while the semiconductor wafer is stored and the fluorine compound or the chlorine compound is formed in the surface of the electrode pad.

(2) Further, when the surface protective film is being processed by the dry etching method, the fluorine (F) or the chlorine (Cl) enters the polyimide film from the etching gas. It is considered that while the semiconductor wafer is stored, the fluorine (F) or the chlorine (Cl) that has entered the polyimide film gradually escapes and gradually reacts with oxygen (O) contained in the atmosphere, so that the fluorine compound or the chlorine compound is formed in the surface of the electrode pad. In this case, the fluorine (F) or the chlorine (Cl) gradually escapes from the polyimide film, so that it is estimated that the thickness of the fluorine compound or the chlorine compound increases as the storage time increases.

(3) As a countermeasure against electromigration, in the electrode pad, copper (Cu) or the like is contained in the aluminum (Al). Therefore, a battery effect is generated between the aluminum (Al) and the copper (Cu) and an electric current flows between them. Therefore, it is considered that the corrosion in the surface of the electrode pad advances further.

First Embodiment

Figure 2A:
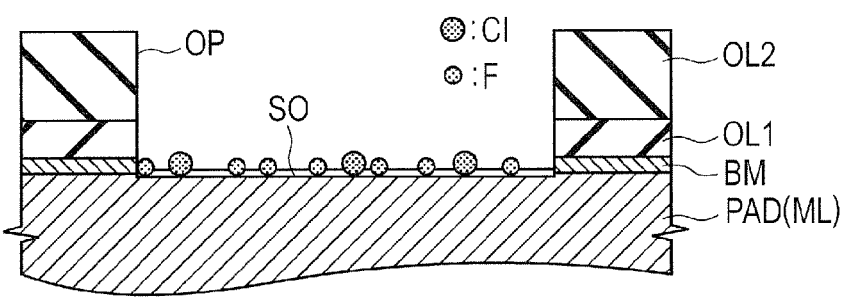
FIGS. 2A to 2C are main portion cross-sectional views of an electrode pad for explaining a manufacturing process of the semiconductor device according to the first embodiment.
Figure 2B:
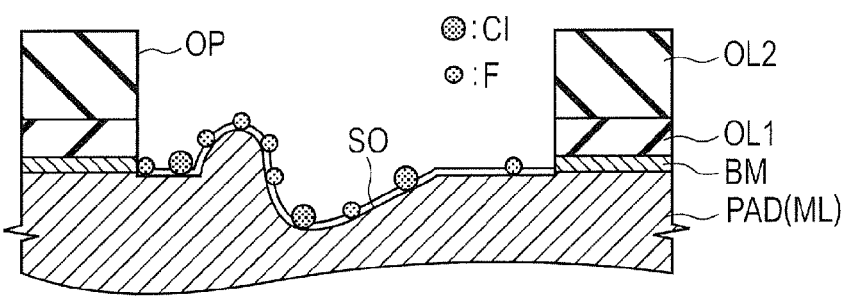
Figure 2C:
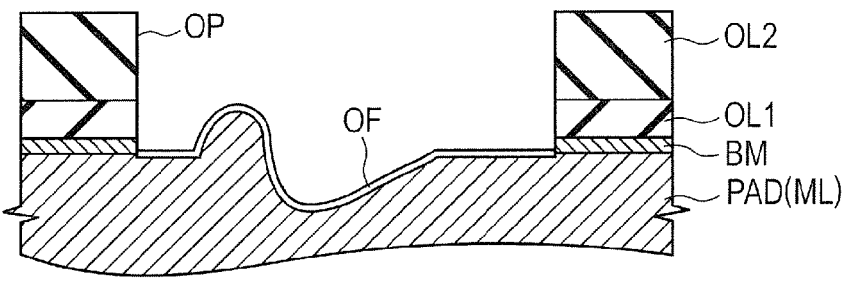
Figure 3:
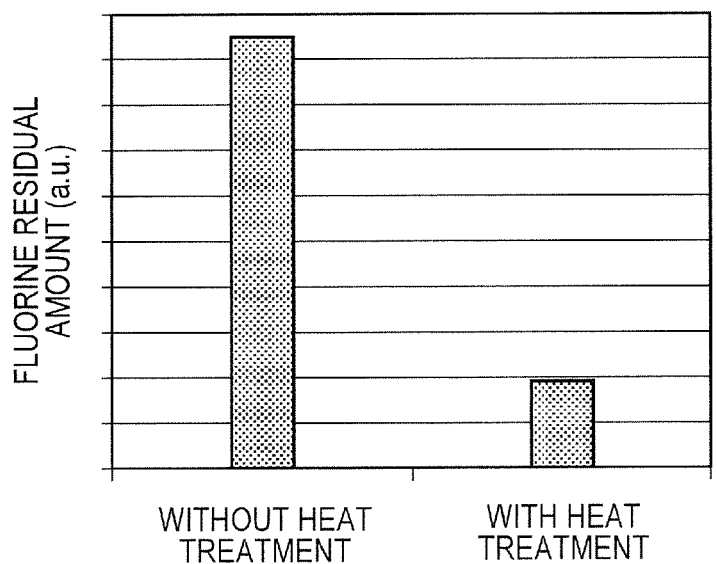
FIG. 3 is a graph showing a fluorine residual amount over a semiconductor wafer according to the first embodiment.
Figure 4:
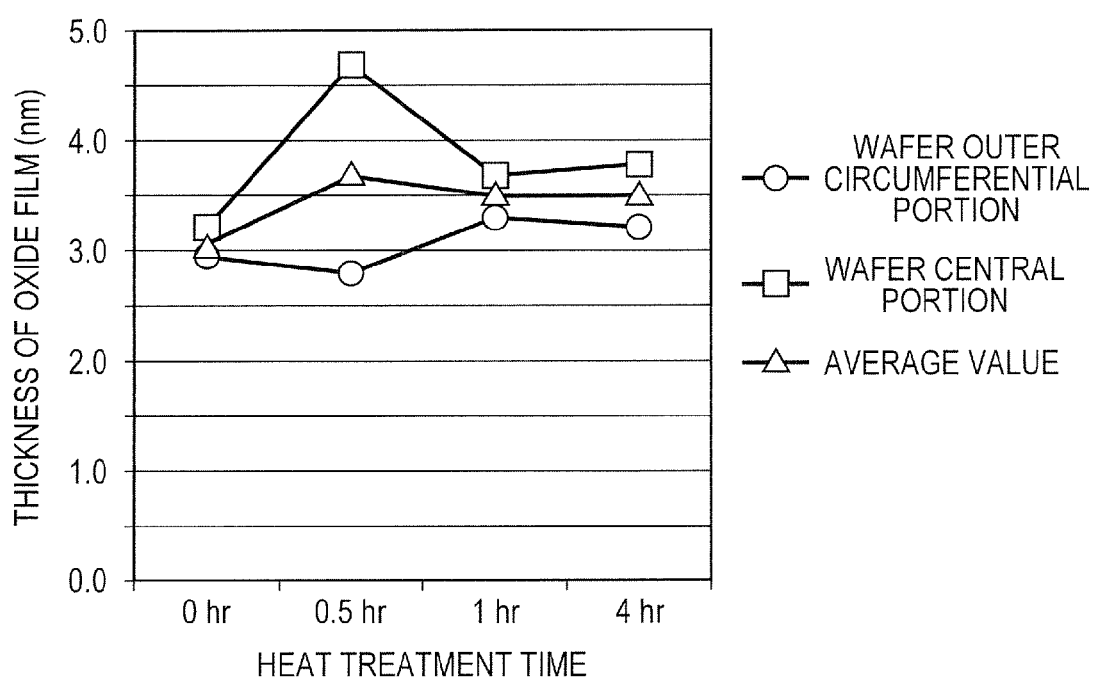
FIG. 4 is a graph showing a relationship between a thickness of an oxide film formed over the electrode pad and a heat treatment time according to the first embodiment.
Figure 5:
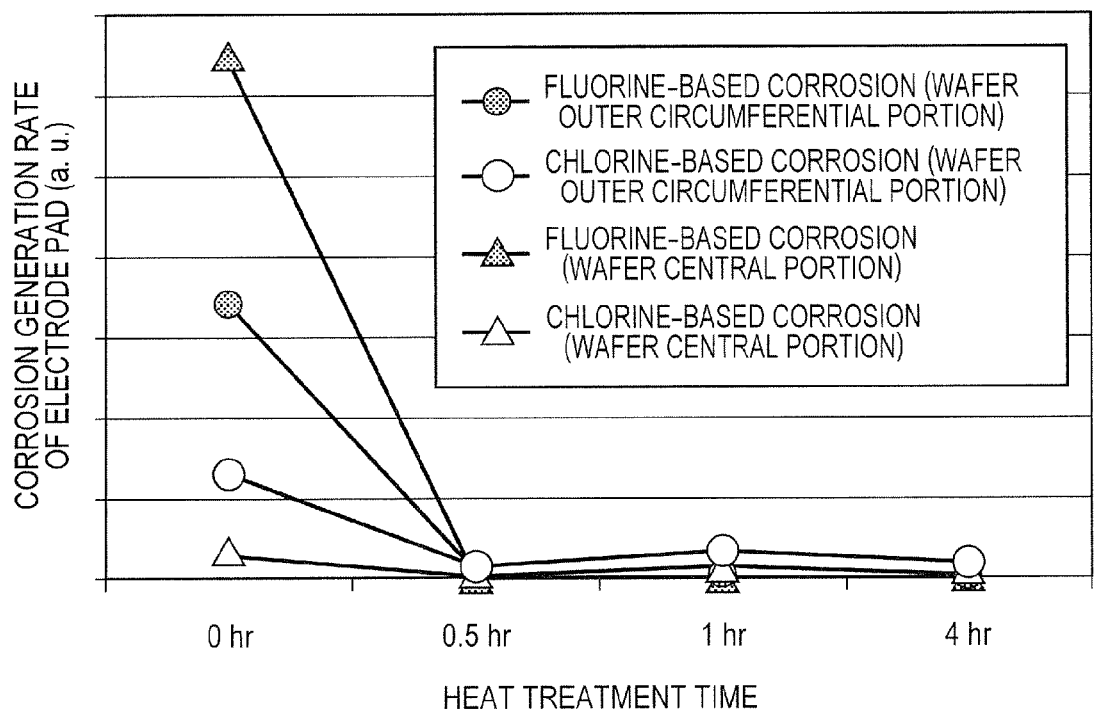
FIG. 5 is a graph showing a relationship between a corrosion generation rate of the electrode pad and the heat treatment time according to the first embodiment.

A manufacturing method of a semiconductor device according to a first embodiment will be described with reference to FIGS. 1 to 5. FIG. 1 is a process drawing for explaining a flow of the manufacturing method of the semiconductor device according to the first embodiment. FIG. 2 is main portion cross-sectional views of an electrode pad for explaining a manufacturing process of the semiconductor device according to the first embodiment. FIG. 3 is a graph showing a fluorine residual amount over a semiconductor wafer according to the first embodiment. FIG. 4 is a graph showing a relationship between a thickness of an oxide film formed over the electrode pad and a heat treatment time according to the first embodiment. FIG. 5 is a graph showing a relationship between a corrosion generation rate of the electrode pad and the heat treatment time according to the first embodiment.

Manufacturing Method of Semiconductor Device

1. Wafer Completion

First, an integrated circuit is formed over a main surface (also referred to as a circuit forming surface or a surface) of the semiconductor wafer. For example, various semiconductor elements such as a field effect transistor, a resistor, and a capacitor are formed over the main surface of the semiconductor wafer formed of a silicon (Si) single crystal and the semiconductor elements are electrically coupled through a multilayer wiring layer in which a plurality of insulating layers and a plurality of wiring layers are stacked. The semiconductor wafer is not limited to silicon (Si) but may be a compound semiconductor formed of gallium arsenide (GaAs), silicon carbide (SiC), or the like.

As shown in FIG. 2 (a), the uppermost wiring layer ML is formed of, for example, an electrically conductive material mainly including aluminum (Al). To improve electromigration resistance, copper (Cu) or the like is introduced into the electrically conductive material, and further a barrier metal film BM formed of, for example, titanium nitride (TiN) is formed over the electrically conductive material. The thickness of the uppermost wiring layer ML is, for example, 0.4 μm to 6.0 μm. A plurality of electrode pads (also referred to as surface electrodes or pad electrodes) PAD are formed of an electrically conductive material in the same layer as the uppermost wiring layer ML.

Subsequently, a first insulating member OL1 is formed over the main surface of the semiconductor wafer so as to cover the uppermost wiring layer ML (including the electrode pads PAD). The first insulating member OL1 is an inorganic insulating film and is formed of, for example, a silicon oxynitride (SiON) film, a silicon oxide ($SiO_2$) film, a silicon nitride ($Si_3N_4$) film, or a laminated film of a silicon oxide ($SiO_2$) film and a silicon nitride ($Si_3N_4$) film. The above film is formed by, for example, a plasma CVD (Chemical Vapor Deposition) method. The thickness of the first insulating member OL1 is, for example, 0.6 μm to 0.8 μm.

Subsequently, a second insulating member OL2 is formed over the main surface of the semiconductor wafer. The second insulating member OL2 is an organic insulating film and is formed of, for example, a polyimide film (for example, PIQ (Polyimide-isoindoloquinazolinedion)). The above film is formed by, for example, a spin coating method. The thickness of the second insulating member OL2 is, for example, about 5 μm. The polyimide film is effective against software error and is effective for alleviating thermal stress with a sealing resin.

Subsequently, the second insulating member OL2 is processed by a dry etching method by using a resist pattern formed by a lithography technique as a mask (omitted in the drawings) and the second insulating member OL2 over the electrode pad PAD is removed. Subsequently, the first insulating member OL1 is processed by a dry etching method and the first insulating member OL1 over the electrode pad PAD is removed. At this time, the barrier metal film BM over the electrode pad PAD is also removed and an opening portion OP that exposes the surface of the electrode pad PAD is formed in the first insulating member OL1 and the second insulating member OL2.

When the first insulating member OL1 and the second insulating member OL2 are processed by the dry etching method, an etching gas including a halogen-based gas such as, for example, fluorine (F) or chlorine (Cl) is used. Therefore, fluorine (F) or chlorine (Cl) remains in the surface of the electrode pad PAD that exposes to the opening OP formed in the first insulating member OL1 and the second insulating member OL2 through a natural oxide film SO. The natural oxide film SO is an aluminum oxide ($Al_2O_3$) film and the thickness of the film is about 5 nm or less. However, the thickness of the natural oxide film SO varies in the surface of the semiconductor wafer, so that the thickness is uneven.

Further, when the first insulating member OL1 and the second insulating member OL2 are processed by the dry etching method, an halogen-based gas such as fluorine (F) or chlorine (Cl), which is contained in the etching gas, enters inside the second insulating member OL2 formed of an organic insulating film, and a part of the halogen-based gas remains even after the processing is completed.

2. Wafer Test

Subsequently, as shown in FIG. 2 (b), the good or the defective state for each semiconductor chip is determined by causing a probe needle (also referred to as an exploring needle) formed of, for example, tungsten (W) to be in contact with the electrode pad, measuring electrical characteristics of an integrated circuit for each semiconductor chip formed in the semiconductor wafer, and causing a tester to read the electrical characteristics.

3. Heat Treatment (Baking Treatment)

Subsequently, as shown in FIG. 2 (c), an oxide film OF having a uniform thickness is uniformly formed over the surface of the electrode pad PAD with a probe mark by performing a heat treatment on a semiconductor wafer where the wafer test is completed. The oxide film OF is an aluminum oxide ($Al_2O_3$) film. When the thickness of the oxide film OF is thin, the oxide film OF having a uniform thickness may not be formed. On the other hand, when the thickness of the oxide film OF is thick, there occurs a problem that the heat treatment time increases and a manufacturing turnaround time (TAT) increases, and further there is a possibility that a coupling failure occurs between the electrode pad PAD and a conductive member coupled to the electrode pad PAD. When taking these into account, it is considered that an appropriate thickness range of the oxide film OF is 2 nm to 6 nm and the most appropriate range is a range around 4 nm.

It is considered that an appropriate range of a heat treatment temperature is, for example, from 200° C. to 300° C. and an air atmosphere or an oxide atmosphere is appropriate as a heat treatment atmosphere because the oxide film OF is formed. Although described later in detail, it is considered that an appropriate heat treatment time is, for example, 30 minutes in a batch-type baking furnace.

Further, the halogen-based gas such as, for example, the fluorine (F) or the chlorine (Cl), which remains in the exposed surface of the electrode pad PAD and the second insulating member OL2, is removed by the heat treatment.

4. Storage

Thereafter, the semiconductor wafer is stored in a clean room until the semiconductor wafer is transferred to the next process. When the semiconductor wafer is stored, the semiconductor wafer is packaged in a case that houses a plurality of semiconductor wafers or is packaged in a case that houses one semiconductor wafer. When the semiconductor wafer is stored for a long time, the case in which the semiconductor wafer is housed is put in a packaging bag, the packaging bag is deaerated, and thereafter the semiconductor wafer is stored with the case and the packaging bag.

Effect of Heat Treatment

FIG. 3 is a graph showing a fluorine residual amount over the semiconductor wafer in a case in which the heat treatment is performed and in a case in which the heat treatment is not performed. The heat treatment temperature is 250° C. and the heat treatment atmosphere is the air atmosphere.

As shown in FIG. 3, it is possible to reduce the fluorine residual amount over the semiconductor wafer to about 20% by performing the heat treatment.

FIG. 4 is a graph showing a relationship between the thickness of the aluminum oxide ($Al_2O_3$) film formed over the electrode pad and the heat treatment time. The heat treatment temperature is 250° C. and the heat treatment atmosphere is the air atmosphere. A batch-type baking furnace is used for the heat treatment.

As shown in FIG. 4, it is known that, for example, an oxide film with a thickness of about 3.5 nm is formed over the surface of the electrode pad by a heat treatment of 30 minutes or more. Even when the heat treatment is not performed, a natural oxide film with a thickness of about 3 nm or less is formed over the surface of the electrode pad. However, the thickness of the natural oxide film varies in the surface of the semiconductor wafer, so that the thickness is uneven. On the other hand, the variation of the thickness of the oxide film actively formed over the surface of the electrode pad by the heat treatment in the surface of the semiconductor wafer is smaller than that of the natural oxide film and the thickness is almost uniform, so that it is possible to uniformly form the oxide film over the surface of the electrode pad.

The following is considered as an effect obtained by uniformly forming an oxide film with a uniform thickness over the surface of the electrode pad.

As shown in FIG. 3, it is possible to reduce the fluorine residual amount over the semiconductor wafer by performing the heat treatment. However, even when the heat treatment is performed, the halogen-based gas remaining in the second insulating member cannot be completely removed and only the absolute amount of the halogen-based gas is reduced, so that some of the halogen-based gas may remain even after the heat treatment is completed. Therefore, while the semiconductor wafer is stored, the halogen-based gas remaining in the second insulating member may gradually escape from the second insulating member and attach to the surface of the electrode pad. However, in the first embodiment, the oxide film with a uniform thickness is uniformly formed over the surface of the electrode pad, so that even if the halogen-based gas gradually escapes from the second insulating member while the semiconductor wafer is stored, the halogen-based gas does not attach to the surface of the electrode pad. Therefore, it is possible to prevent the corrosion of the surface of the electrode pad.

FIG. 5 is a graph showing a relationship between a corrosion generation rate of the electrode pad and the heat treatment time. The heat treatment temperature is 250° C. and the heat treatment atmosphere is the air atmosphere. A batch-type baking furnace is used for the heat treatment. The corrosion generation rate of the electrode pad is measured after the semiconductor wafer is stored at a humidity of 100% for a predetermined time (0 minute, 30 minutes, 1 hour, and 4 hours).

As shown in FIG. 5, in both cases of fluorine-based corrosion and chlorine-based corrosion, it is known that the corrosion generation rate of the electrode pad is significantly reduced by the heat treatment of 30 minutes or more.

As described above, according to the first embodiment, it is possible to remove the halogen-based gas such as, for example, the fluorine (F) or the chlorine (Cl), which remains in the exposed surface of the electrode pad PAD and the second insulating member OL2, so that it is possible to prevent the corrosion of the surface of the electrode pad PAD. Further, the oxide film OF with a uniform thickness of, for example, about 3.5 nm is uniformly formed over the surface of the electrode pad PAD, so that even if the halogen-based gas gradually escapes from the second insulating member OL2 while the semiconductor wafer is stored, the halogen-based gas does not directly come into contact with the surface of the electrode pad PAD. Therefore, it is possible to prevent the corrosion of the surface of the electrode pad PAD.

Second Embodiment

Figure 6:
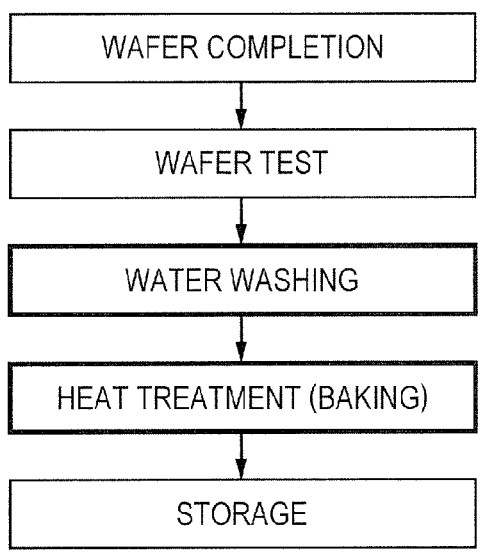
FIG. 6 is a process drawing for explaining a flow of a manufacturing method of a semiconductor device according to a second embodiment.
Figure 7A:
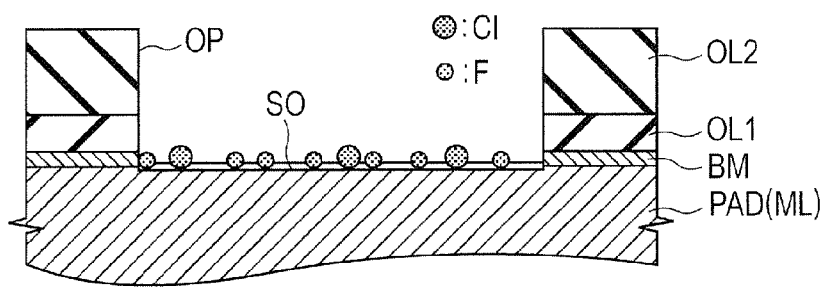
FIGS. 7A to 7D are main portion cross-sectional views of an electrode pad for explaining a manufacturing process of the semiconductor device according to the second embodiment.
Figure 7B:
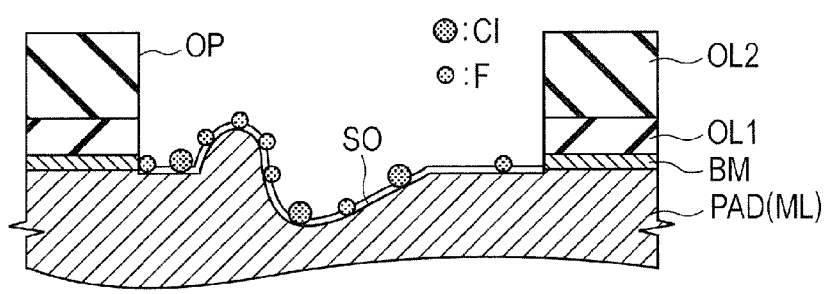
Figure 7C:
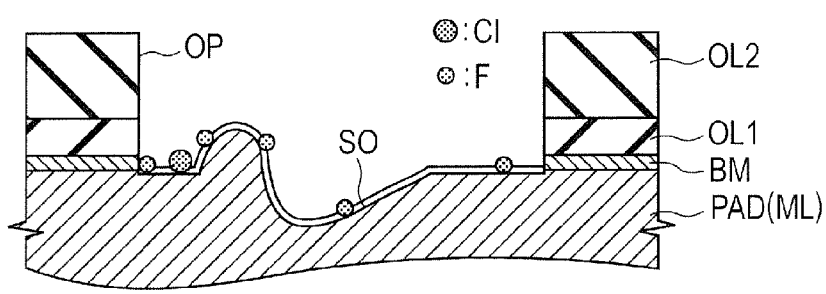
Figure 7D:
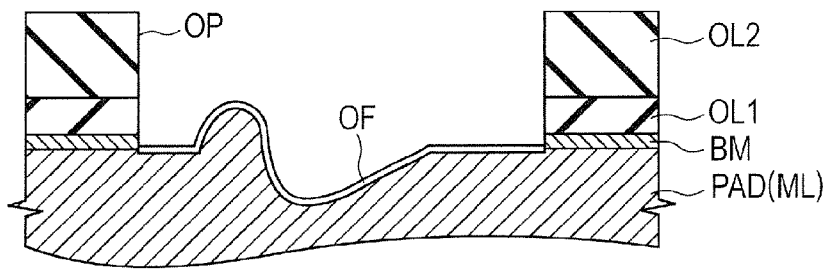

A manufacturing method of a semiconductor device according to a second embodiment will be described with reference to FIGS. 6 and 7. FIG. 6 is a process drawing for explaining a flow of the manufacturing method of the semiconductor device according to the second embodiment. FIG. 7 is main portion cross-sectional views of an electrode pad for explaining a manufacturing process of the semiconductor device according to the second embodiment.

A difference from the first embodiment described above is that water washing is added between the wafer test and the heat treatment (baking treatment) as shown in FIGS. 6 and 7 in the second embodiment. Specifically, as shown in FIGS. 7 (a) and (b), a wafer test is performed by causing a probe needle formed of, for example, tungsten (W) to come into contact with the electrode pad PAD. Subsequently, as shown in FIG. 7 (c), the water washing is performed on the semiconductor wafer where the wafer test is completed, and the halogen-based gas such as, for example, the fluorine (F) or the chlorine (Cl) is removed from the surface of the electrode pad PAD by the water washing. Thereafter, as shown in FIG. 7 (d), a heat treatment is performed on the semiconductor wafer, and the oxide film OF is formed over the exposed surface of the electrode pad PAD by the heat treatment. Further, the halogen-based gas such as, for example, the fluorine (F) or the chlorine (Cl), which remains in the exposed surface of the electrode pad PAD and the second insulating member OL2, is removed.

Therefore, the water washing is performed before the heat treatment, so that the halogen-based gas which remains in the surface of the electrode pad PAD during the heat treatment reduces as compared with a case in which the heat treatment is performed without water washing, and it is possible to form the oxide film OF having a more uniform thickness.

Ultra-pure water (for example, nonconductive water whose amount of impurities is about 0.001 μg/L) is used for the water washing. It is possible to use batch-type water washing in which a plurality of semiconductor wafers are dipped into a pool filled with the ultra-pure water or to use sheet type water washing of spin washing.

Although the water washing is performed before the heat treatment in the second embodiment, the water washing may be performed after the heat treatment. In this case, after the halogen-based gas is removed from the exposed surface of the electrode pad PAD and the second insulating member OL2 by the heat treatment, the halogen-based gas attached to the exposed surface of the electrode pad PAD is further removed by the water washing, so that it is considered that the effect of removing the halogen-based gas is more improved.

Third Embodiment

Figure 8:
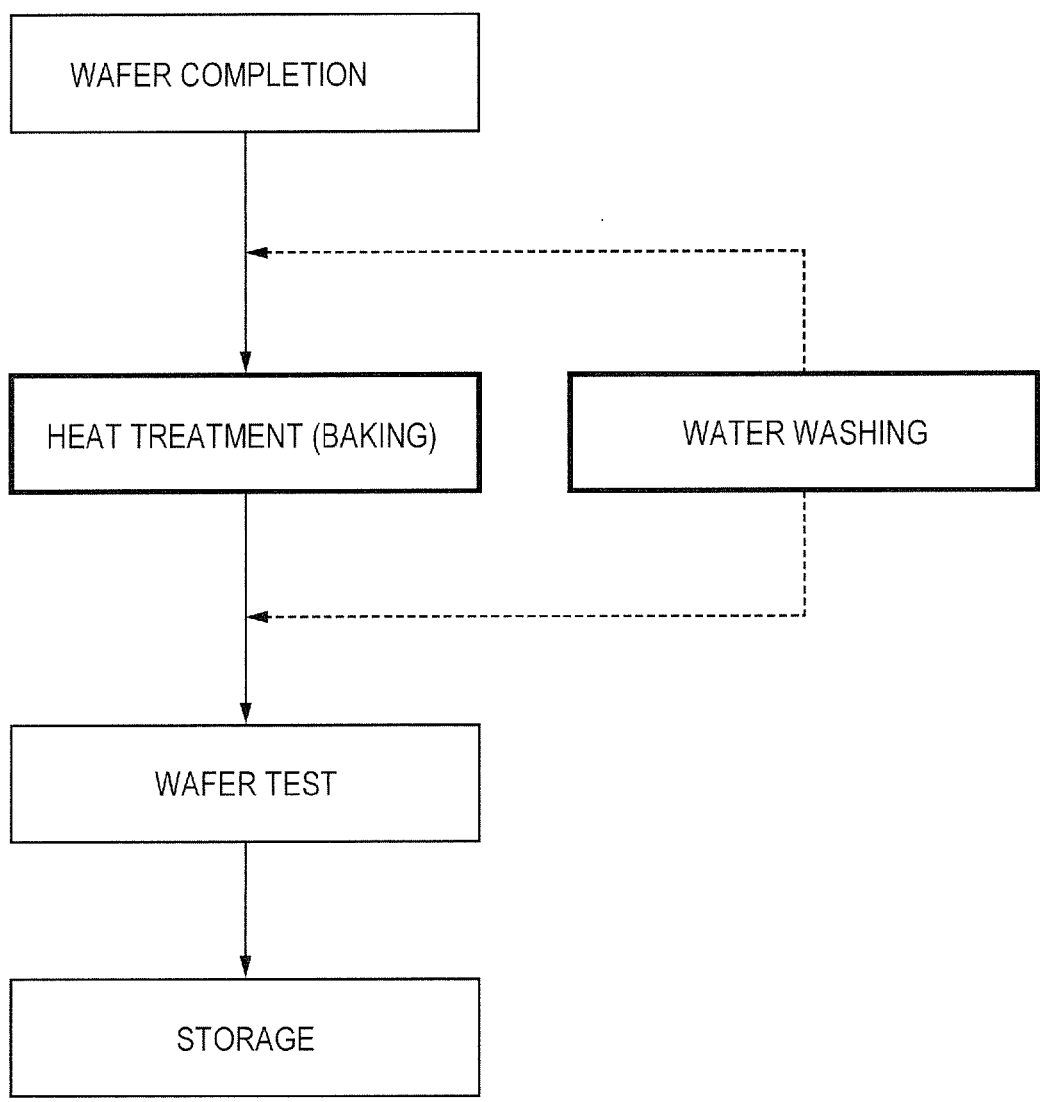
FIG. 8 is a process drawing for explaining a flow of a manufacturing method of a semiconductor device according to a third embodiment.
Figure 9A:
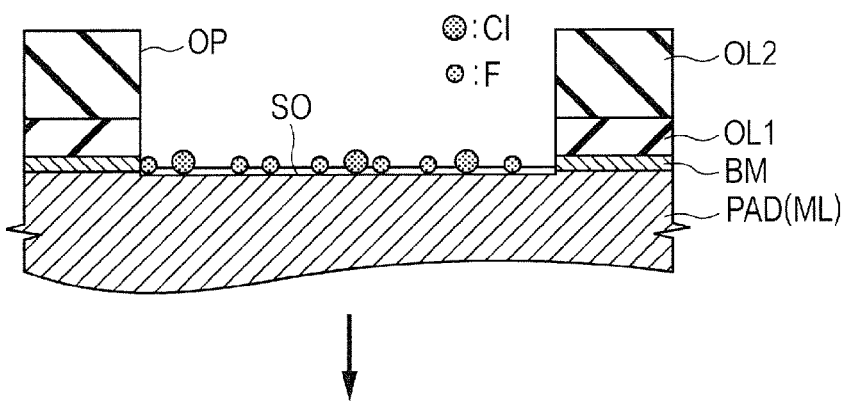
FIGS. 9A to 9C are main portion cross-sectional views of an electrode pad for explaining a manufacturing process of the semiconductor device according to the third embodiment.
Figure 9B:
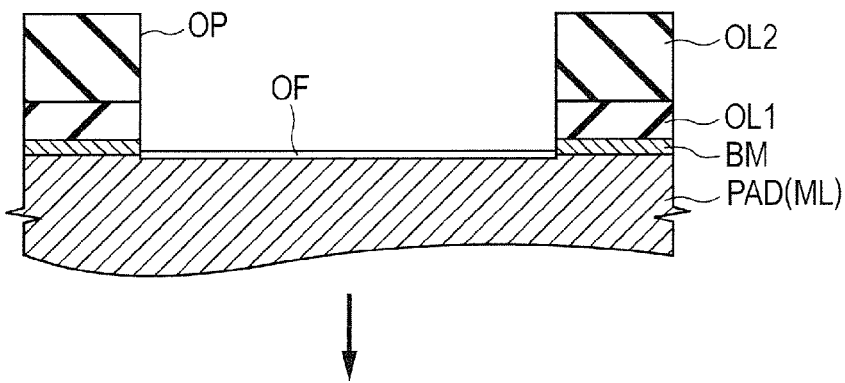
Figure 9C:
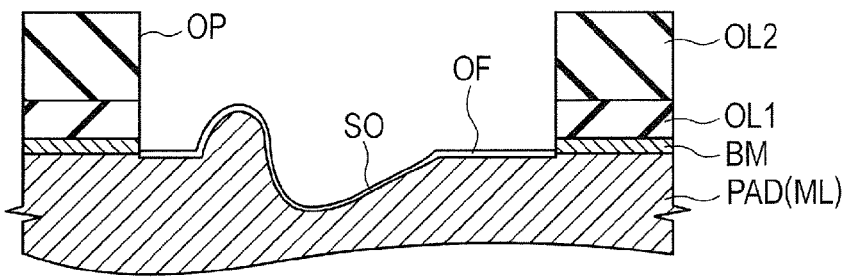

A manufacturing method of a semiconductor device according to a third embodiment will be described with reference to FIGS. 8 and 9. FIG. 8 is a process drawing for explaining a flow of the manufacturing method of the semiconductor device according to the third embodiment. FIG. 9 is main portion cross-sectional views of an electrode pad for explaining a manufacturing process of the semiconductor device according to the third embodiment.

A difference from the first embodiment described above is that the wafer test is performed after the heat treatment (baking) as shown in FIGS. 8 and 9 in the third embodiment. Specifically, as shown in FIGS. 9 (a) and (b), it is possible to uniformly form the oxide film OF having a uniform thickness over the exposed surface of the electrode pad PAD by performing a heat treatment on the semiconductor wafer. Further, it is possible to reduce the halogen-based gas such as, for example, the fluorine (F) or the chlorine (Cl), which remains in the exposed surface of the electrode pad PAD and the second insulating member OL2.

However, in the third embodiment, after the oxide film OF having a uniform thickness is uniformly formed over the exposed surface of the electrode pad PAD, electrical characteristics of an integrated circuit for each semiconductor chip formed in the semiconductor wafer are measured by causing a probe needle to come into contact with the electrode pad PAD. Therefore, as shown in FIG. 9 (c), the oxide film OF over the surface of the electrode pad PAD which the probe needle comes into contact with is scraped off, so that the thickness of a portion of the oxide film OF which the probe needle comes into contact with decreases or all the portion of the oxide film OF which the probe needle comes into contact with may be removed. However, thereafter, the natural oxide film SO is formed in the portion which the probe needle comes into contact with, so that the surface of the electrode pad PAD is covered by the oxide film OF and the natural oxide film SO although the thickness of the films is uneven. Therefore, it is possible to prevent the corrosion of the surface of the electrode pad PAD while the semiconductor wafer is stored.

Further, the water washing described in the second embodiment may be performed between the wafer completion and the heat treatment (baking treatment), or between the heat treatment (baking treatment) and the wafer test, or between the wafer completion and the heat treatment (baking treatment) and between the heat treatment (baking treatment) and the wafer test. By adding the water washing, the effect of removing the halogen-based gas is more improved than a case of using only the heat treatment.

The heat treatment may be performed on the semiconductor wafer while the wafer test is being performed. Also in this case, it is possible to obtain the same effect as that described above.

Fourth Embodiment

Figure 10:
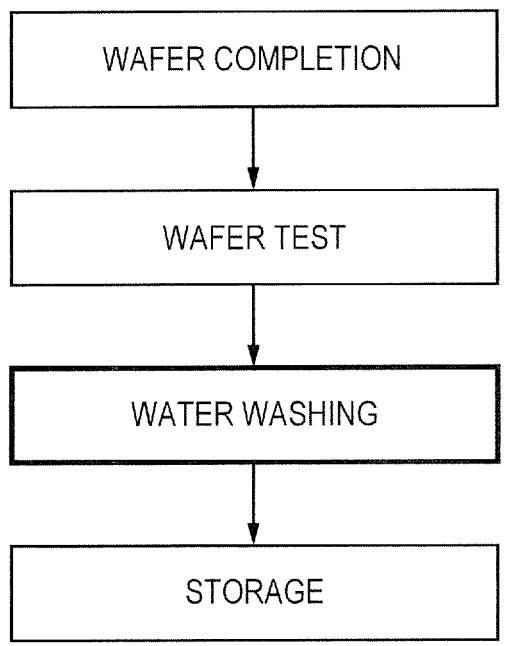
FIG. 10 is a process drawing for explaining a flow of a manufacturing method of a semiconductor device according to a fourth embodiment.
Figure 11:
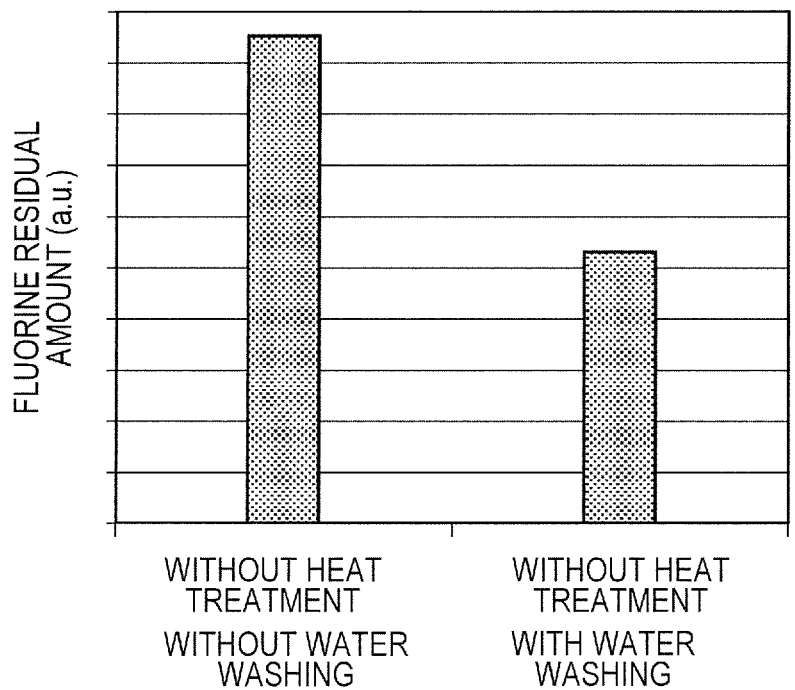
FIG. 11 is a graph showing a fluorine residual amount over a semiconductor wafer according to the fourth embodiment.

A manufacturing method of a semiconductor device according to a fourth embodiment will be described with reference to FIGS. 10 and 11. FIG. 10 is a process drawing for explaining a flow of the manufacturing method of the semiconductor device according to the fourth embodiment. FIG. 11 is a graph showing a fluorine residual amount over the semiconductor wafer in a case in which only the water washing is performed after the wafer test according to the fourth embodiment and in a case in which the water washing is not performed.

In the fourth embodiment, a difference from the first embodiment described above is that the water washing is performed instead of the heat treatment (baking treatment) as shown in FIG. 10. Specifically, by performing the water washing, it is possible to remove the halogen-based gas such as, for example, the fluorine (F) or the chlorine (Cl), which remains in the exposed surface of the electrode pad, so that it is possible to prevent the corrosion of the surface of the electrode pad.

In the same manner as the water washing described in the second embodiment, ultra-pure water (for example, nonconductive water whose amount of impurities is about 0.001 μg/L) is used for the water washing. It is possible to use batch-type water washing in which a plurality of semiconductor wafers are dipped into a pool filled with the ultra-pure water or to use sheet type water washing of spin washing.

In the fourth embodiment, the heat treatment described in the first embodiment described above is not performed on the semiconductor wafer, so that the halogen-based gas that remains in the second insulating member is not removed. Further, an oxide film with a uniform thickness is not formed over the exposed surface of the electrode pad and a natural oxide film with an uneven thickness is formed. Therefore, while the semiconductor wafer is stored for a long time, there is a possibility that the halogen-based gas gradually escapes from the second insulating member and the corrosion of the surface of the electrode pad progresses.

However, as shown in FIG. 11, it is possible to reduce the fluorine residual amount over the semiconductor wafer to about a half by performing the water washing. Therefore, as compared with a case in which only the heat treatment is performed, when only the water washing is performed, the removing effect of the halogen-based gas is low, however, the halogen-based gas is obviously removed, so that it is possible to more prevent the corrosion of the surface of the electrode pad while the semiconductor wafer is stored than in a case in which none of the heat treatment and the water washing is performed.

While the invention made by the inventors has been specifically described based on the embodiments, it is needless to say that the present invention is not limited to the embodiments and may be variously modified within the scope of the invention.

What is claimed is:

1. A manufacturing method of a semiconductor device, comprising the steps of:
   (a) forming an electrode pad over a main surface of a semiconductor wafer and a barrier metal film over the electrode pad;
   (b) forming an insulating member over the main surface of the semiconductor wafer so as to cover the electrode pad;
   wherein the insulating member comprises an inorganic insulating film covering the barrier metal film and an organic insulating film covering the inorganic insulating film;
   (c) forming an opening portion where a surface of the electrode pad is exposed in the insulating member by processing the insulating member by a dry etching method using an etching gas including a halogen-based gas;
   (d) forming an oxide film having a thickness of 2 nm to 6 nm over the exposed surface of the electrode pad and partially removing halogen by performing a heat treatment in a range of 200° C. to 300° C. in an atmosphere including oxygen for at least 30 minutes;
   (e) after the step (d), storing the semiconductor wafer; and
   wherein a halogen residual amount is reduced by 20% by performing the heat treatment in step (d).

2. The manufacturing method of a semiconductor device according to claim 1, wherein a temperature of the heat treatment in the step (d) is 250° C.

3. The manufacturing method of a semiconductor device according to claim 1,
wherein a fluorine compound or a chlorine compound is formed over the surface of the electrode pad which is exposed to the opening portion in the step (c).

4. The manufacturing method of a semiconductor device according to claim 1, further comprising the step of:
(f) water-washing the exposed surface of the electrode pad between the step (c) and the step (d) or between the step (d) and the step (e).

5. The manufacturing method of a semiconductor device according to claim 1, further comprising the step of:
(g) measuring electrical characteristics of an integrated circuit for each semiconductor chip formed in the semiconductor wafer by causing a probe needle to come into contact with the electrode pad for each semiconductor chip between the step (c) and the step (d) or between the step (d) and the step (e).

6. The manufacturing method of a semiconductor device according to claim 1,
wherein an average thickness of the oxide film is 3 nm to 4 nm.

7. The manufacturing method of a semiconductor device according to claim 1,
wherein the halogen-based gas is fluorine or chlorine.

8. The manufacturing method of a semiconductor device according to claim 1,
wherein the electrode pad is formed of aluminum oxide.

* * * * *